(12) United States Patent
Feldman

(10) Patent No.: US 6,424,094 B1
(45) Date of Patent: Jul. 23, 2002

(54) ORGANIC ELECTROLUMINESCENT DISPLAY WITH INTEGRATED RESISTIVE TOUCH SCREEN

(75) Inventor: Rodney D. Feldman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/855,452

(22) Filed: May 15, 2001

(51) Int. Cl.$^7$ ................................................. G09G 3/10
(52) U.S. Cl. .............................. 315/169.3; 340/825.81; 345/173; 345/206
(58) Field of Search .......................... 315/169.2, 169.3; 340/825.79, 825.81, 825.82, 825.89; 345/173, 206, 55, 76, 80

(56) References Cited

U.S. PATENT DOCUMENTS

| | | | |
|---|---|---|---|
| 4,893,115 A | * | 1/1990 | Blanchard .................... 341/22 |
| 5,937,232 A | | 8/1999 | Taguchi et al. ............... 399/81 |
| 6,035,180 A | * | 3/2000 | Kubes et al. ............... 313/509 |

OTHER PUBLICATIONS

Osgood et al., Touch Screen Controller Tips, Burr–Brown Application Bulletin AB–158, Apr. 2000, pp. 1–9.
Touch–Screen Controller, Burr–Brown Products from Texas Instruments, 1999, Production data information ADS7846, pp. 1–18.
USSN: 09/774,221, filed Jan. 30, 2001 by Feldman et al.
USSN: 09/826,194, filed Apr. 4, 2001 by Siwinski et al.
USSN:, (Docket No. 82,691) filed concurrently by Feldman et al.

* cited by examiner

*Primary Examiner*—Don Wong
*Assistant Examiner*—Thuy Vinh Tran
(74) *Attorney, Agent, or Firm*—Thomas H. Close

(57) ABSTRACT

An organic electroluminescent display with integrated touch screen, includes: a transparent substrate having two faces; a transistor switching matrix and a light emitting layer forming an active matrix electroluminescent display located on one face of the substrate for emitting light through the substrate; touch sensitive elements of a touch screen located on the other face of the substrate; components of a touch screen controller located on the one face of the substrate; and an electrical connector for connecting the components of the touch screen controller on the one face of the substrate to the touch screen elements on the other face of the substrate.

18 Claims, 8 Drawing Sheets

ORGANIC ELECTROLUMINESCENT DISPLAY WITH INTEGRATED RESISTIVE TOUCH SCREEN

FIELD OF THE INVENTION

This invention relates generally to color flat panel displays and, more particularly, to an electroluminescent flat panel display with a resistive touch sensitive panel.

BACKGROUND OF THE INVENTION

Modern electronic devices provide an increasing amount of functionality with a decreasing size. By continually integrating more and more capabilities within electronic devices, costs are reduced and reliability increased. Touch screens are frequently used in combination with conventional soft displays such as cathode ray tubes (CRTs), liquid crystal displays (LCDs), plasma displays and electroluminescent displays. The touch screens are manufactured as separate devices and mechanically mated to the viewing surfaces of the displays.

There are three common types of resistive touch screens, 4-wire, 5-wire, and 8-wire. The three types share similar structures. FIG. 1a shows a top view of a resistive touch screen 10 and the external circuitry to which it is connected. FIG. 1b shows a side view of the resistive touch screen 10. The touch sensitive elements 14 of the resistive touch screen 10 includes a lower circuit layer 20; a flexible spacer layer 22 containing a matrix of spacer dots 24; a flexible upper circuit layer 26; and a flexible top protective layer 28. All of these layers are transparent. The lower circuit layer 20 comprises conductive materials placed on a substrate 12, forming a circuit pattern.

The main difference between 4-wire, 5-wire, and 8-wire touch screens is the circuit pattern in the lower circuit layer 20 and in the upper circuit layer 26, and the means for making resistance measurements. An external controller 18 is connected to the touch screen circuitry via cable 16. Conductors in cable 16 are connected to the circuitry within the lower circuit layer 20 and the upper circuit layer 26. The external controller 18 coordinates the application of voltages to the touch screen circuit elements. When a resistive touch screen is pressed, the pressing object, whether a finger, a stylus, or some other object, deforms the top protective layer 28, the upper circuit layer 26, and the spacer layer 22, forming a conductive path at the point of the touch between the lower circuit layer 20 and the upper circuit layer 26. A voltage, called a touch coordinate voltage, is formed in proportion to the relative resistances in the circuit at the point of touch, and is measured by the external controller 18 connected to the other end of the cable 16. The controller 18 then computes the (X,Y) coordinates of the point of touch. For more information on the operation of resistive touch screens, see "Touch Screen Controller Tips" by Osgood et al., Application Bulletin AB-158, Burr-Brown, Inc. (Tucson, Arizona).

The external controller 18 is typically an integrated circuit soldered to a printed circuit board 30. Cable 16 is plugged into a connector 32 that is also soldered to the printed circuit board 30. The conductors in the cable 16 connect to the external controller 18 via traces that are placed on the printed circuit board 30 that run between the external controller 18 and the connector 32.

External controller 18 consists of three sub-circuits: a voltage application circuit 34, a touch detection circuit 36, and a multiplexing circuit 38.

The voltage application circuit 34 selects the placement of voltages on the touch screen's electrodes. The touch detection circuit 36 monitors the voltage read from the touch screen, decides when a touch has been performed, and computes the (X, Y) coordinates of the touch point. The (X, Y) coordinates of the touch point are then transferred to another integrated circuit 39 on the circuit board, often a microprocessor. External controllers are available commercially, for example, the ADS7846 by Texas Instruments (Dallas, Tex.).

As shown in FIG. 2, the touch detection circuit 36 often contains an analog-to-digital converter 40 and a computation circuit 42. Analog-to-digital converter 40 converts the analog voltage measured at the point of touch to a digital value. The computation circuit 42 is often an embedded processor or other circuit that can monitor the digital voltage value, detect the presence of a touch based on the voltage value, and compute the coordinate of the touch based on the magnitude of the digital voltage value. Other processing may be performed, such as averaging to minimize noise.

The multiplexing circuit 38 in FIG. 1a determines which conductors in the cable 16 are routed to the voltage application circuit 34 and to the touch detection circuit 36. This routing changes for determining the X and Y coordinates. The external controller 18 is usually responsive to a clock generated on the printed circuit board 30, and also has voltage inputs. The cable 16 would contain four conductors for 4-wire touch screens, five conductors for 5-wire touch screens, and eight conductors for 8-wire touch screens. The multiplexing circuit 38 would have two wires going to the voltage application circuit 34 and two wires going to the touch detection circuit 36 for 4-wire touch screens. The multiplexing circuit 38 would have four wires going to the voltage application circuit 34 and one wire going to the touch detection circuit 36 for 5-wire touch screens.

FIG. 3 shows a cross section view of a typical prior art electroluminescent display such as an organic light emitting diode (OLED) flat panel display 70 of the type shown in U.S. Pat. No. 5,937,272, issued Aug. 10, 1999 to Tang. The OLED display includes a substrate 72 that provides mechanical support for the display device, a transistor switching matrix layer 74, a light emission layer 78 containing materials forming organic light emitting diodes, and a cable 80 for connecting circuitry within the flat panel display to external controller 81. The substrate 72 is typically glass, but other materials, such as plastic, may be used. The transistor switching matrix layer 74 contains a two-dimensional matrix of thin film transistors (TFTs) 76 that are used to select which pixel in the OLED display that receives image data at a given time. The thin film transistors 76 are manufactured using conventional semiconductor manufacturing processes, and therefore extra thin film transistors 76 may be used to form circuitry for a variety of uses. As mentioned in U.S. Serial No. 09/774,221 filed Jan. 30, 2001, by Peldman et al., the presence of TFTs within an active matrix flat panel display allow functions other than display functions to be implemented on the same substrate as the display function, producing a system-on-panel. The OLED display is responsive to control signals generated by external controller 81. These control signals typically include a pixel clock (sometimes called a dot clock), a vertical synchronization signal (VSYNC), and a horizontal synchronization (HSYNC) signal.

Conventionally, when a touch screen is used with a flat panel display, the touch screen is simply placed over the flat panel display, and the two are held together by a mechanical mounting means such as a frame. FIG. 4 shows such an arrangement with a touch screen mounted on an OLED flat panel display. After the touch screen and the OLED display are assembled, the two substrates 12 and 72 are placed together in a frame 82, often separated by a mechanical separator 84. The resulting assembly contains two cables 16 and 80 that connect the touch screen and the flat panel display to external controllers 18 (see FIG. 1a) and 81 (see FIG. 3).

U.S. Serial No. 09/826,194, filed Apr. 4, 2001 by Siwinski et al. proposes a device in which an organic electroluminescent flat panel display is integrated with a touch screen, sharing a common substrate. This invention has advantages over existing touch screen and flat panel display combinations with decreased cost, no integration steps, decreased weight and thickness, and improved optical quality.

As mentioned above, an external controller 18 controls conventional resistive touch screens. Such resistive touch screens are manufactured for simplicity, and therefore do not contain semiconductor circuitry, such as thin film transistors, that can be used to implement a touch screen controller on the touch screen itself.

Conventionally, all signals controlling a touch screen and an active matrix flat panel display are brought into each device via conductors in two cables. Since there is similarity between the operation of a flat panel display and a touch screen, there is redundancy within the signals brought into the devices. This redundancy results in redundant conductors in the cables, adding to cable cost, and providing increased opportunities for noise to enter the devices via these conductors. Additionally, the associated connector or connectors on the printed circuit board contain redundant pins, further increasing system cost and opportunities for electronic noise injection.

There remains a need therefore for an improved touch screen-flat panel display system that minimizes device weight, removes redundant materials, decreases cost, eliminates special mechanical mounting design, and increases reliability.

SUMMARY OF THE INVENTION

The need is met according to the present invention by providing an organic electroluminescent display with integrated touch screen, that includes: a transparent substrate having two faces; a transistor switching matrix and a light emitting layer forming an active matrix electroluminescent display located on one face of the substrate for emitting light through the substrate; touch sensitive elements of a touch screen located on the other face of the substrate; components of a touch screen controller located on the one face of the substrate, and a electrical connector for connecting the components of the touch screen controller on the one face of the substrate to the touch screen elements on the other face of the substrate.

ADVANTAGES

The present invention has the advantage that the number of conductors for making external connection to the device are minimized, thereby minimizing device weight, removing redundant materials, decreasing cost, eliminating special mechanical mounting design, and increasing reliability

DETAILED DESCRIPTION OF THE INVENTION

Touch screen controllers are semiconductor integrated circuits manufactured using conventional CMOS manufacturing processes, and designed to use transistor switching technology. There is a similarity in the design and manufacturing processes of an active matrix flat panel display and a touch screen controller.

Both active matrix flat panel displays and touch screen controllers are controlled by various control signals synchronized to a clock. Additionally, voltages are applied to touch screens, touch screen controllers, and flat panel displays. Therefore, there is similarity between the operation of an active matrix flat panel display and a resistive touch screen controller.

Thus, according to the present invention, one or more components of a touch screen controller is integrated on a common substrate with the transistor switching matrix of an active matrix flat panel display.

Figure 5A:
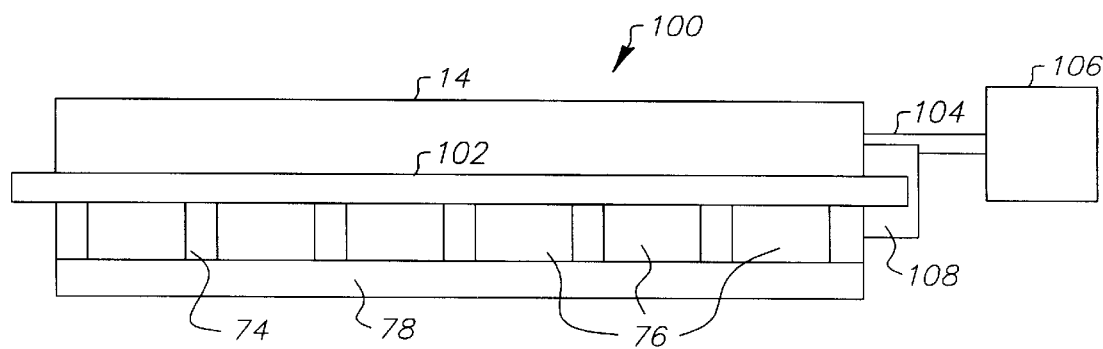
FIGS. 5a and 5b are schematic diagrams showing the basic structure of an electroluminescent display with a touch screen and an integrated touch screen controller.
Figure 5B:
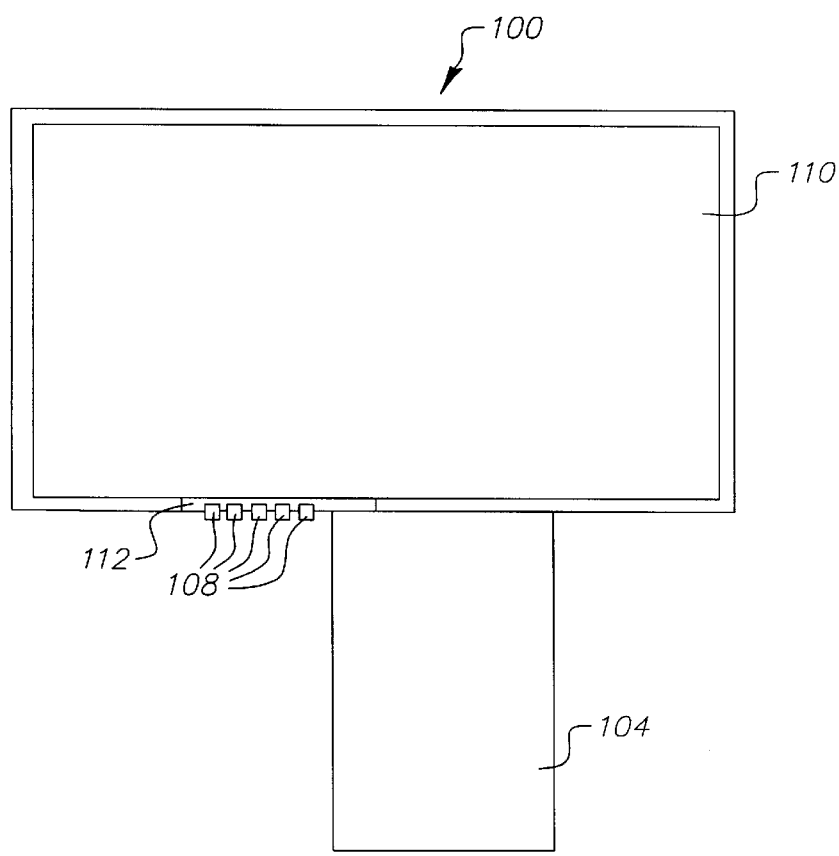

FIG. 5a and b shows a display having an integrated touch screen and touch screen control components according to the present invention. An electroluminescent display generally designated 100 includes a single substrate 102 having a transistor switching matrix layer 74 and a light emission layer 78 containing materials of an electroluminescent display formed on one face of the substrate for emitting light through the substrate, touch sensitive elements 14 of a touch screen formed on the other face of the substrate 102, and a single flex-cable 104 that can be used for connecting the electroluminescent display 100 with external electronics 106 as disclosed in copending U.S. Ser. No. 09/855,449 filed concurrently by Feldman et al. According to the present invention, the transistor switching matrix layer 74 contains thin film transistors 76 that in addition to providing control of the electroluminescent display, also implement a complete, or partial, resistive on-panel touch screen controller 112. The light emission layer 78 contains electroluminescent materials, located in the center part of the electroluminescent display, in an area called the active area 110 of the electroluminescent display.

Figure 1A:
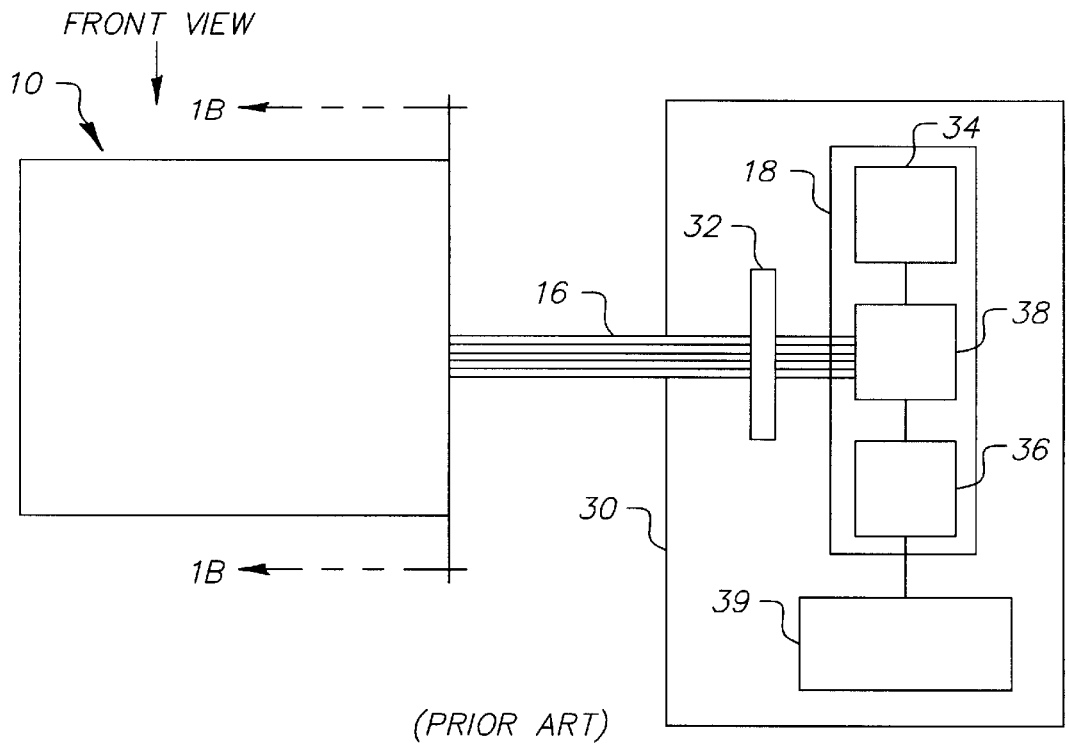
FIGS. 1a and 1b are schematic diagrams showing the basic structure of a prior art touch screen and its controller.
Figure 3:
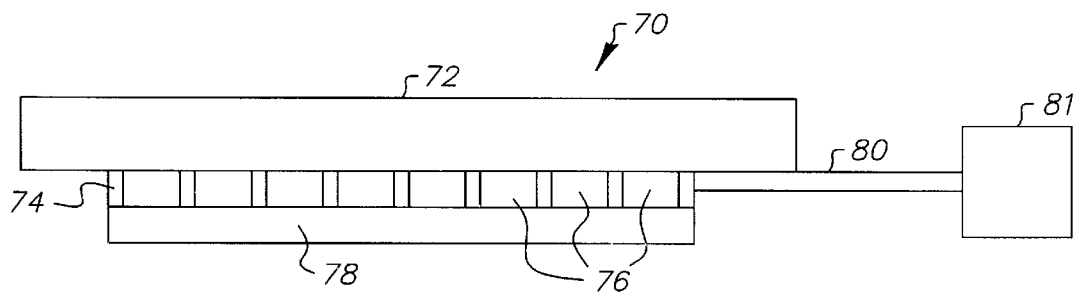
FIG. 3 is a schematic diagram showing the structure of a prior art organic electroluminescent display.
Figure 4:
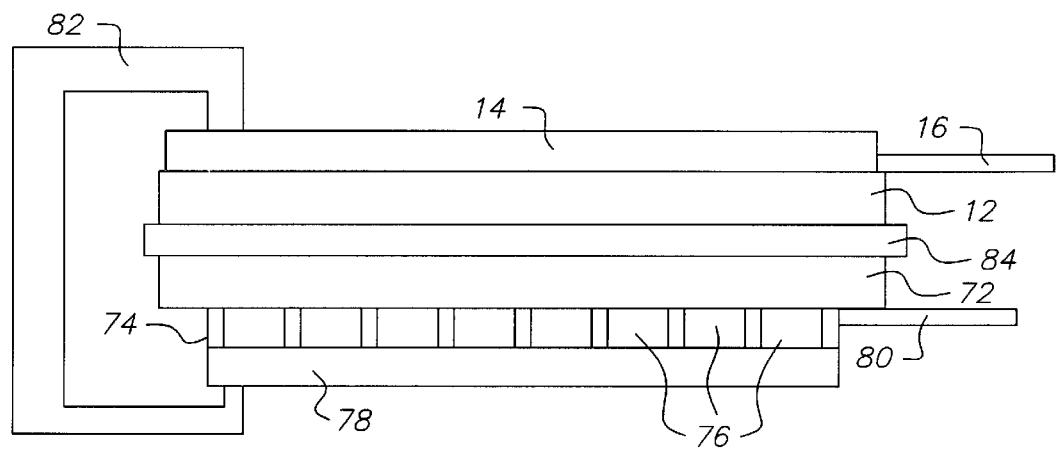
FIG. 4 is a schematic diagram showing the combination of a touch screen with a flat panel electroluminescent display as would be accomplished using conventional techniques.

The substrate 102 is made of a transparent material, such as glass or plastic, and is thick enough to provide mechanical support for the transistor switching matrix layer 74, the light emission layer 78, and the touch sensitive elements 14. Conductors 108 connect the touch sensitive elements 14 to the touch screen controller 112, and are placed on the edges of the substrate 102. The cable 104 contains conductors that allow image data, display control signals, bias voltages, and touch screen signals to pass between external electronics 106 and the electroluminescent display 100. The number of conductors in the cable 104 of this embodiment is less than the number of conductors needed in the cable 16 (see FIG. 1*a*) plus in the cable 80 (see FIG. 3) in the prior art discussed above. This improved display eliminates the need for redundant conductors within the cable 104 and places some or all of the touch screen controller functionality within the display itself. This reduces the amount of raw materials in the system, therefore decreasing system cost, manufacturing cost, and system integration complexity.

Various amounts of touch screen controller functionality may be implemented within the touch screen controller 112, based on system design constraints, Three embodiments are considered here.

Figure 6:
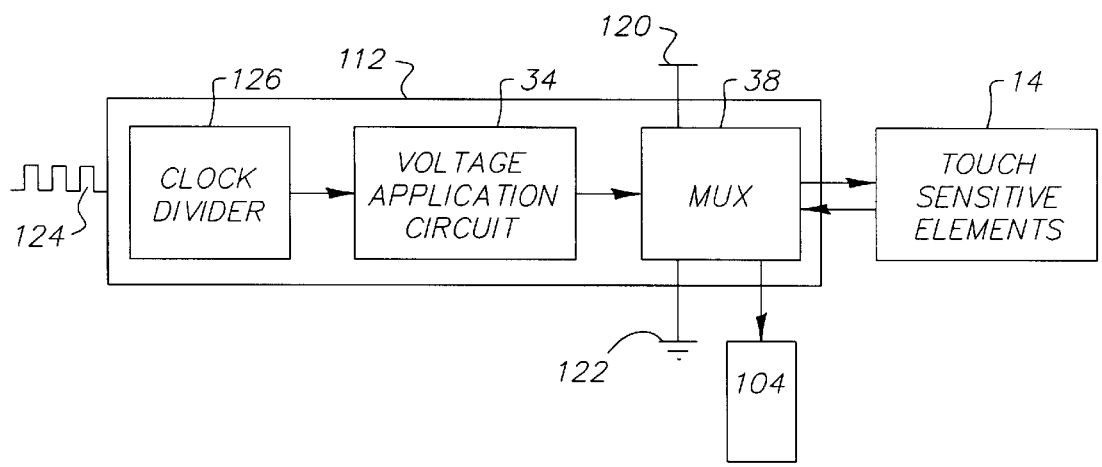
FIG. 6 is a schematic diagram of an electroluminescent touch screen display with components of a touch screen controller integrated on the display including a voltage selection circuit and a multiplexing circuit.

FIG. 6 shows an embodiment of the present invention where the touch screen controller circuit 112 includes an optional clock divider circuit 126, a voltage application circuit 34, and a multiplexing circuit 38. The touch detection circuit is implemented in external electronics 106 (see FIG. 5*a*). Voltages 120 and 122 applied to the touch screen controller circuit 112 are taken from voltages used for normal image display functions. When a touch occurs, the sensed change in voltage, and therefore resistance, is sent over cable 104 to an external controller for (X, Y) coordinate extraction.

The clock divider circuit 126 divides an input clock pulse train 124 into a lower frequency. Typically, the input clock pulse train 124 is taken from a clock needed to control the image display, such as the pixel clock. Alternatively, the horizontal synchronization (HSYNC) or vertical synchronization (VSYNC) pulses may be used as the input clock, since these signals are periodic. Often, these synchronization signals do not have a 50% duty cycle, as do most regular clock signals. A 50% duty cycle may be produced using these synchronization signals by using a frequency divider, such as the clock divider circuit 126. The pixel clock is usually the fastest of the three signals, followed by HSYNC, and then VSYNC. For flat panel displays of VGA resolution and a 60 Hz frame refresh rate, the pixel clock is approximately 30 MHz (assuming a transfer of one pixel per clock cycle), HSYNC is approximately 30 KHz, and VSYNC is 60 Hz. The signal closest in frequency to the needs of the touch screen controller may be selected, in order to minimize the size of the clock divider circuit 126.

The output of the voltage application circuit 34 connects to the multiplexing circuit 38. The multiplexing circuit 38 includes circuitry that routes the appropriate voltages to the appropriate conductive elements within the touch sensitive elements 14 and the touch coordinate voltage to other circuitry for processing. The exact circuit implementation of the multiplexing circuit 38 is specific to the type of touch screen (4-wire or 5-wire). The specific embodiments of the multiplexing circuit 38 are discussed below.

This embodiment of the touch screen controller circuit 112 has the advantages of placing a portion of the touch screen controller circuitry on the display itself, taking advantage of the thin film transistors lithography present in the manufacturing process of the image display. The touch screen controller circuit 112 is relatively simple and small in size, and also eliminates the need for two of the four conductors needed in the cable 104 for conventional 4-wire touch screen controllers by utilizing various signals needed for image display control and biasing. The touch screen controller circuit 112 eliminates the need for four of the five conductors needed in the cable 104 for conventional 5-wire touch screen controllers by utilizing various signals needed for image display control and biasing. The more transistor-intensive and area-intensive touch detection circuit 36 (see FIG. 1*a*) is placed in external electronics 106 (see FIG. 5*a*) on a printed circuit board, where conventional manufacturing processes for such circuitry are more efficient.

Figure 2:
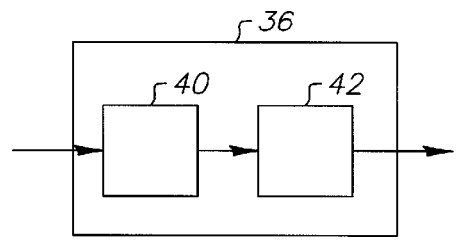
FIG. 2 is a schematic diagram of a prior art resistive touch screen controller.
Figure 7:
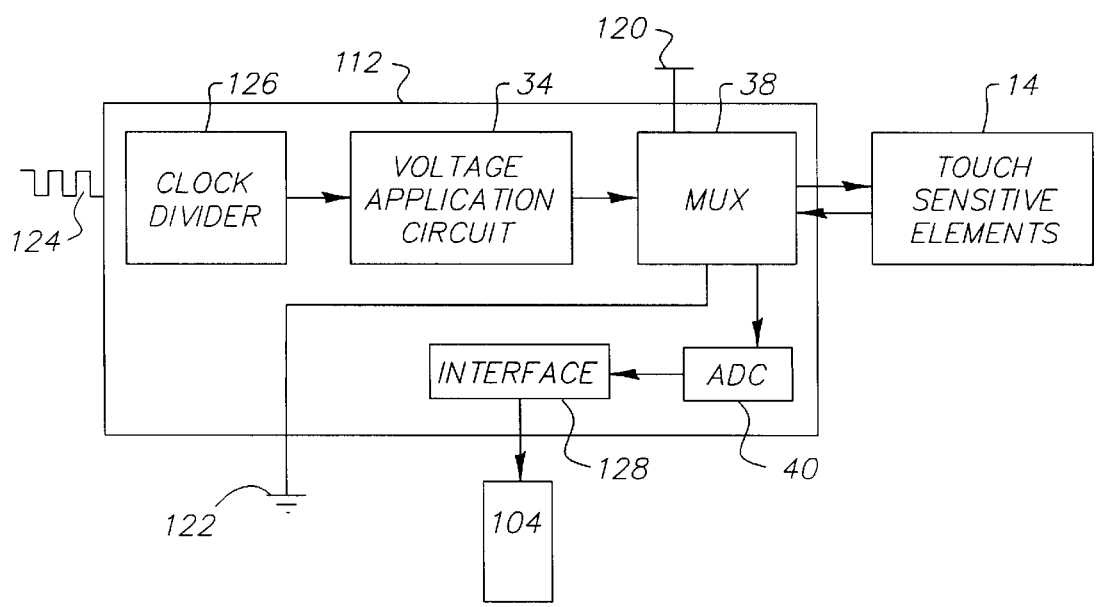
FIG. 7 is a schematic diagram of an electroluminescent touch screen display with components of a touch screen controller integrated on the display including a voltage selection circuit, a multiplexing circuit, an analog-to-digital converter, and a digital transmission circuit.

FIG. 7 shows an embodiment of the present invention where the touch screen controller circuit 112 includes an optional clock divider circuit 126, a voltage application circuit 34, a multiplexing circuit 38, an analog-to-digital converter (ADC) 40, and a digital interface circuit 128. The operation of the clock divider circuit 126, the voltage application circuit 34, and the multiplexing circuit 38 are identical to that described in relation to the embodiment of FIG. 6. In the embodiment shown in FIG. 7, the touch voltage output of the multiplexing circuit 38 is routed to the input of analog-to-digital converter (ADC) 40 that converts the analog voltage measured by the touch sensitive elements into a digital form. The digitized voltage is transmitted, via digital interface circuit 128, over one or more conductors within cable 104 to a computation circuit 42 (see FIG. 2) in external electronics 106 (see FIG. 5*a*), where the digital voltage is converted to a touch coordinate.

The digital interface circuit 128 may transmit the digital data serially or in parallel. Because human tactile response times are usually slow as compared to a display pixel clock, transmission of digital touch data is often performed serially, lowering the data rate, but eliminating one or more conductors associated with parallel transmission. The digital interface circuit 128 is usually synchronized to a known clock, such as the pixel clock. This embodiment has the advantage of converting the measured voltage to digital form before transmission over the cable 104 to external electronics on a printed circuit board. This significantly improves the noise immunity of the measured voltage, allowing for a more accurate touch position calculation.

Figure 8:
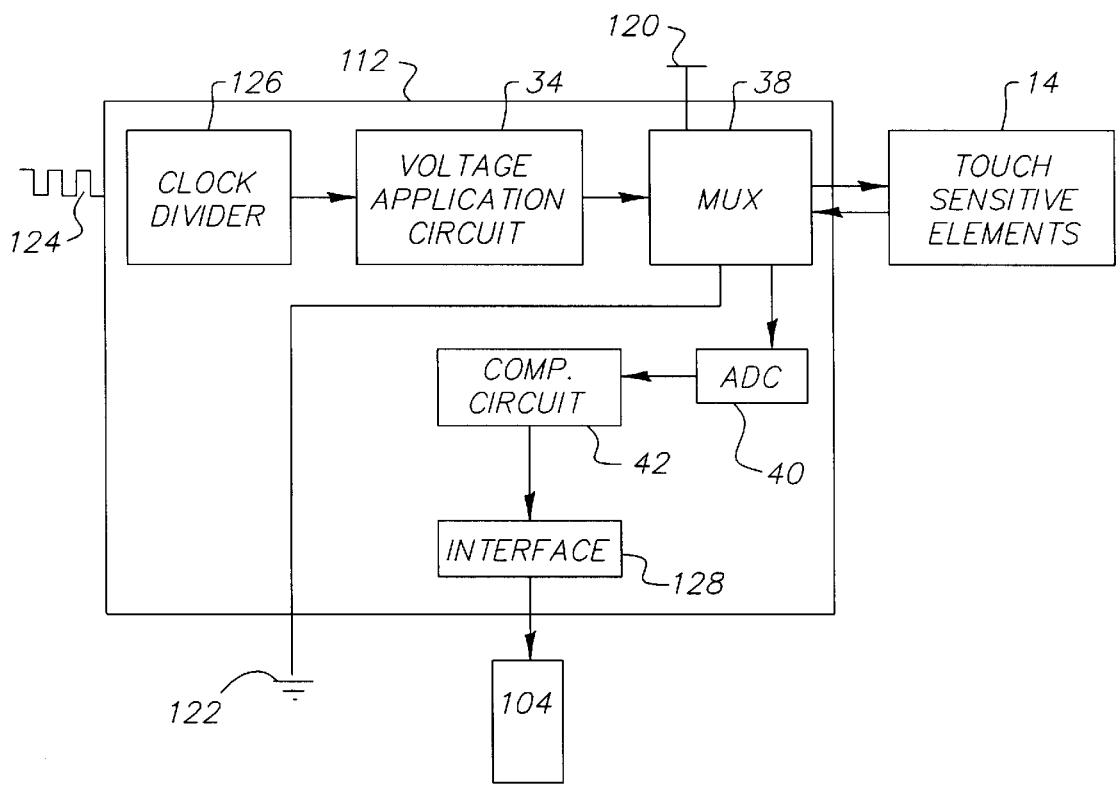
FIG. 8 is a schematic diagram of an electroluminescent touch screen display with components of a touch screen controller integrated on the display including a voltage selection circuit, a multiplexing circuit, analog-to-digital converter, a computation circuit, and a digital transmission circuit.

FIG. 8 shows an embodiment of the present invention where the touch screen controller circuit 112 includes an optional clock divider circuit 126, a voltage application circuit 34, a multiplexing circuit 38, an analog-to-digital converter (ADC) 40, a computation circuit 42, and a digital interface circuit 128. The operation of the clock divider circuit 126, the voltage application circuit 34, the multiplexing circuit 38, the analog-to-digital converter 40, and the digital interface circuit 128 are identical to that described in relation to the embodiment of FIG. 7. In this embodiment, the output of the analog-to-digital converter 40 is routed to the input of the computation circuit 42. The computation circuit 42 allows the touch screen coordinate to be computed on the electroluminescent display itself, and the touch screen coordinate to be transmitted to external electronics 106 (see FIG. 5a) via the digital interface circuit 128. This embodiment has the advantage of producing the touch screen coordinate on the electroluminescent display 100 itself The entire touch screen function is then contained in one device, improving system design via improved partitioning of circuit functions. Additional circuitry is not required in the external electronics 106 (see FIG. 5a) for resistive touch screen operation, improving time-to-market for systems containing an electroluminescent display 100.

Figure 1B:
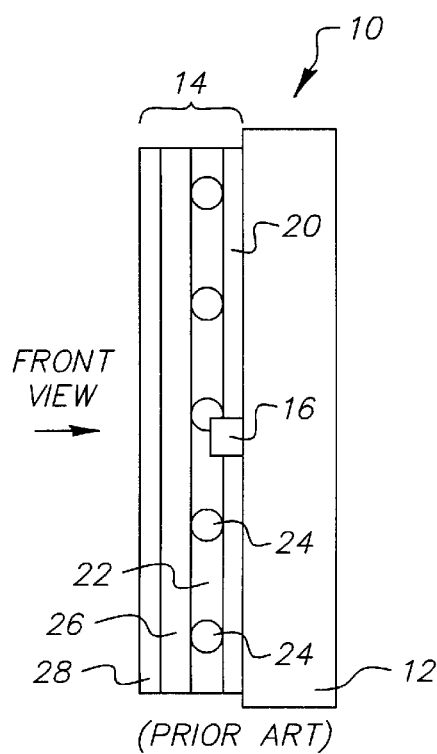
Figure 9:
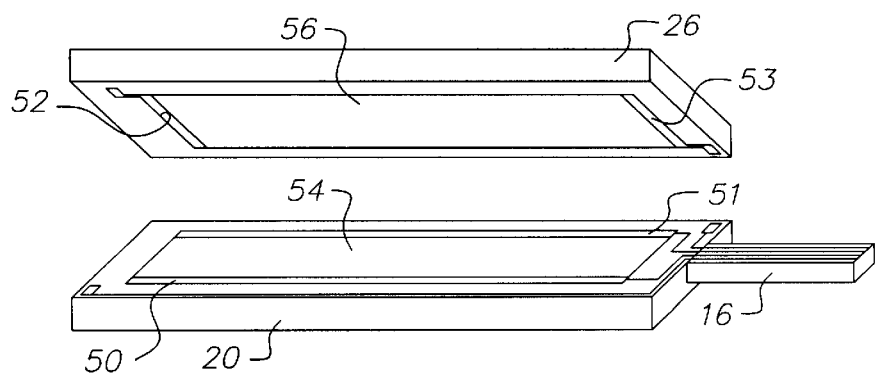
FIG. 9 is a schematic diagram showing a prior art 4-wire resistive touch screen.

FIG. 9 shows the electrical structure of a prior art 4-wire resistive touch screen. The lower circuit layer 20 contains two parallel metal bars 50 and 51 oriented in one direction, and a resistive ITO coating 54 extending between the metal bars 50 and 51. The upper circuit layer 26 contains two metal bars 52 and 53 perpendicular to metal bars 50 and 51, and a resistive ITO coating 56 extending between the metal bars 52 and 53. The lower circuit layer 20 and the upper circuit layer 26 are separated by a flexible spacer layer 22 (see FIG. 1b) containing a matrix of spacer dots. To sense a touch, an external touch screen controller applies a voltage between two parallel metal bars, forming a voltage gradient in the intervening resistive ITO coating. The other two parallel metal bars are then used as voltage probe points. When the touch occurs, two resistive ITO coatings 54 and 56 are shorted at the point of contact. The voltage at that point on the first resistive ITO coating is transferred to the second resistive ITO coating. A corresponding voltage occurs across the other set of parallel metal bars, and is transferred via conductors in cable 16 to the touch detection circuit 36 within external touch screen controller 18, shown in FIG. 1. The touch detection circuit 36 (see FIG. 1) monitors the voltage read from the touch screen, decides when a touch has been performed, and computes the (X, Y) coordinates of the touch point the voltage placed across the first two parallel metal bars. To measure the X coordinate, a voltage gradient is applied to parallel metal bars 52 and 53. To measure the Y coordinate, a voltage gradient is applied to parallel metal bars 50 and 51.

Figure 10A:
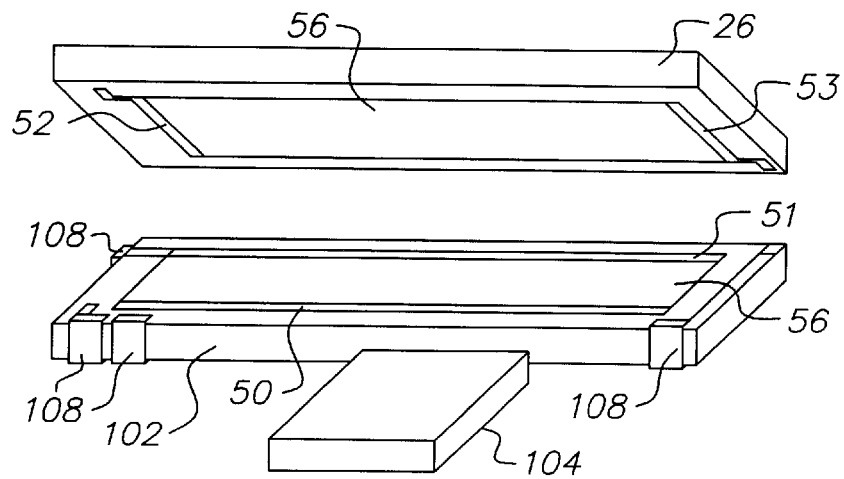
FIGS. 10a and 10b are schematic diagrams showing a 4-wire touch screen according to the present invention.
Figure 10B:
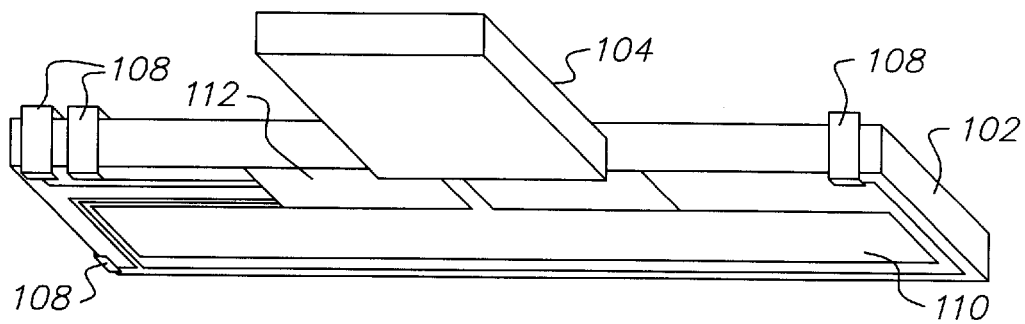

An improved flat panel display and 4-wire resistive touch screen system utilizes a single substrate incorporating touch sensitive elements, light emitting materials, a single cable, and touch screen controller circuitry. FIG. 10a and b show this embodiment. The touch sensitive elements 14 shown in FIG. 5a implement a 4-wire resistive touch screen in the embodiment of FIGS. 10a and 10b, and are placed on the top of the substrate 102. An electroluminescent display having an active area 110 is formed on the bottom of the substrate 102. Circuitry 112 implementing a portion or all of a resistive touch screen controller is also formed on the bottom face of the substrate 102. Metal bars 50, 51, 52 and 53 in the resistive touch screen elements are connected to the resistive touch screen controller 112 via conductors 108.

Various amounts of touch screen controller functionality may be implemented within the touch screen controller 112, based on system design constraints, as described in relation to FIGS. 6, 7 and 8. This circuitry may be used for both 5-wire and 4-wire touch screens, The main difference between implementations for the two types of touch screens is the implementation of the multiplexing circuit 38.

Figure 11:
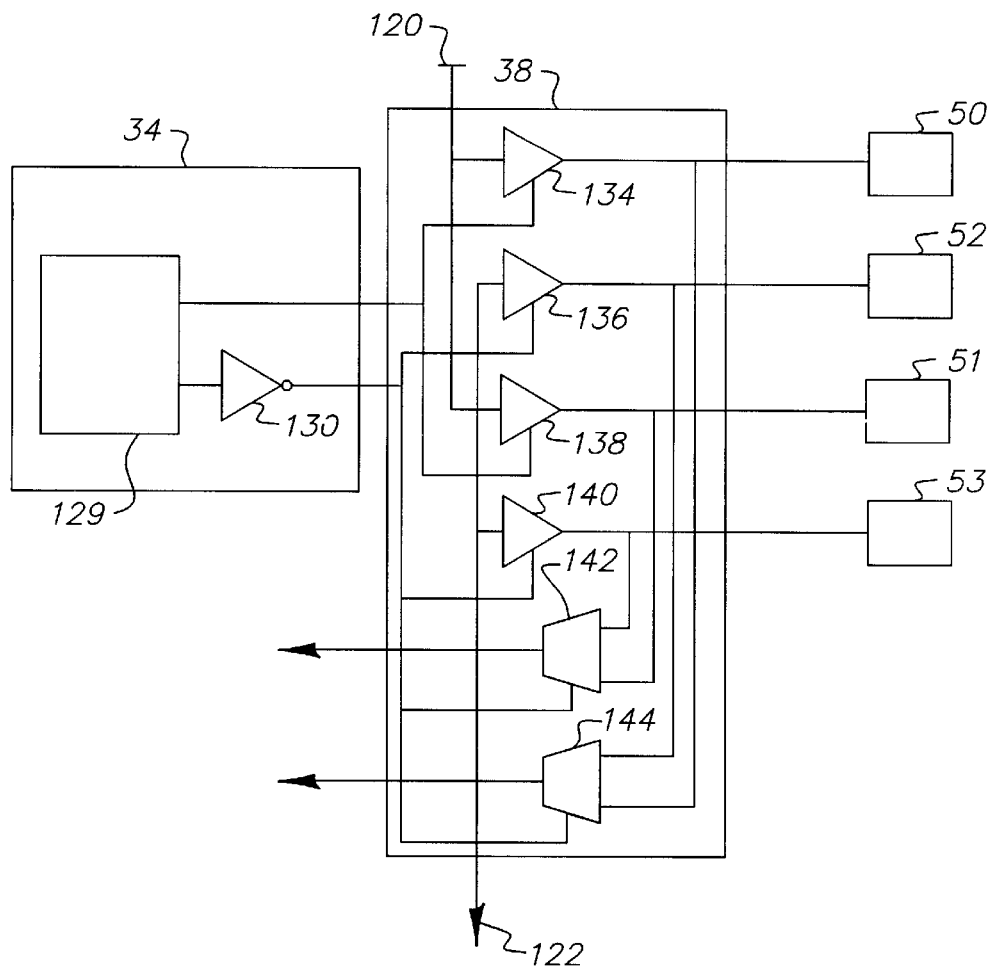
FIG. 11 is a schematic diagram of a voltage selection circuit and a multiplexing circuit for 4-wire touch screen controllers, according to the present invention.

FIG. 11 shows an embodiment of the present invention for a voltage application circuit 34 and a multiplexing circuit 38 used with a 4-wire touch screen. The voltage application circuit 34 contains circuitry that selects how the voltages are applied to the electrodes of the touch sensitive elements 14, and therefore controls the coordinate of the point of touch being read. The voltage application circuit 34 consists of an X/Y coordinate selection circuit 129 and an inverter 130. The X/Y coordinate selection circuit 129 is typically a flip-flop that may be toggled on each cycle of its input clock. When the flip-flop is in the low state, the X coordinate is being measured. When the flip-flop is in the high state, the Y coordinate is being measured. An inverter 130 is used to produce the inverse of the flip-flop output.

The multiplexing circuit 38 contains four analog tristate buffers 134, 136, 138 and 140, and two electronic switches 142 and 144. Each tristate buffer drives its input voltage to the appropriate metal bars when enabled, and prevents voltage transmission when disabled. For the embodiments considered here, a logic high on a tristate buffer's enable input allows the input voltage to pass to the output, while a logic low disables the transmission of the input voltage to the output. Each electronic switch passes one of two input voltages to its output, based on the logic level of its voltage selection signal. For the embodiments considered here, a logic high on the voltage selection signal passes the upper input voltage to the output of the electronic switch, as drawn in FIG. 11. A logic low on the voltage selection signal passes the lower input voltage to the output of the electronic switch.

Referring to FIGS. 10a and 11, when the X/Y coordinate selection circuit 129 contains a logic high, tristate buffers 134 and 138 are enabled, while tristate buffers 136 and 140 are disabled. Thus, voltage 120 is placed on metal bar 50 and voltage 122 is placed on metal bar 51. Metal bars 52 and 53 are not driven by either voltage 120 or 122. A voltage gradient is then placed across resistive ITO coating 54, allowing a touch to be detected in the Y direction. When a touch occurs, a voltage proportional to the Y coordinate of the touch location is transferred to the resistive ITO coating 56 in the upper circuit layer 26. Accordingly, voltages are transferred to metal bars 52 and 53. Electronic switches 142 and 144 then transfer these voltages to an analog-to-digital converter (not shown) or conductors within a cable (not shown). Using these voltages, the Y coordinate of the touch location may be computed.

When the X/Y coordinate selection circuit 129 contains a logic low, tristate buffers 136 and 140 are enabled, while tristate buffers 134 and 138 are disabled. Thus, voltage 120 is placed on metal bar 52 and voltage 122 is placed on metal bar 53. Metal bars 50 and 51 are not driven by either voltage 120 or 122. A voltage gradient is then placed across resistive ITO coating 56, allowing a touch to be detected in the X direction. When a touch occurs, a voltage proportional to the X coordinate of the touch location is transferred to the resistive ITO coating 54 in the lower circuit layer 20. Accordingly, voltages are transferred to metal bars 50 and 51. Electronic switches 142 and 144 then transfer these voltages to an analog-to-digital converter (not shown) or conductors within a cable (not shown). Using these voltages, the X coordinate of the touch location may be computed.

Figure 12:
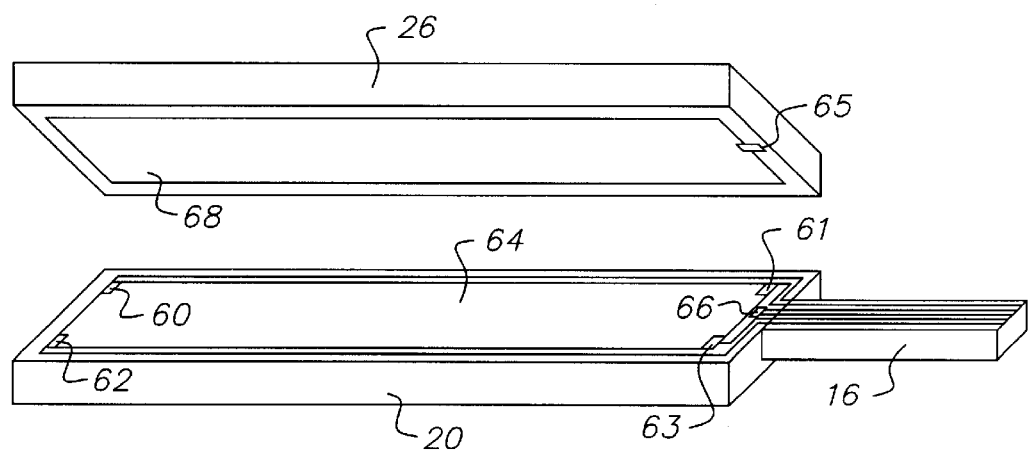
FIG. 12 is a schematic diagram showing a prior art 5-wire resistive touch screen.
Figure 13A:
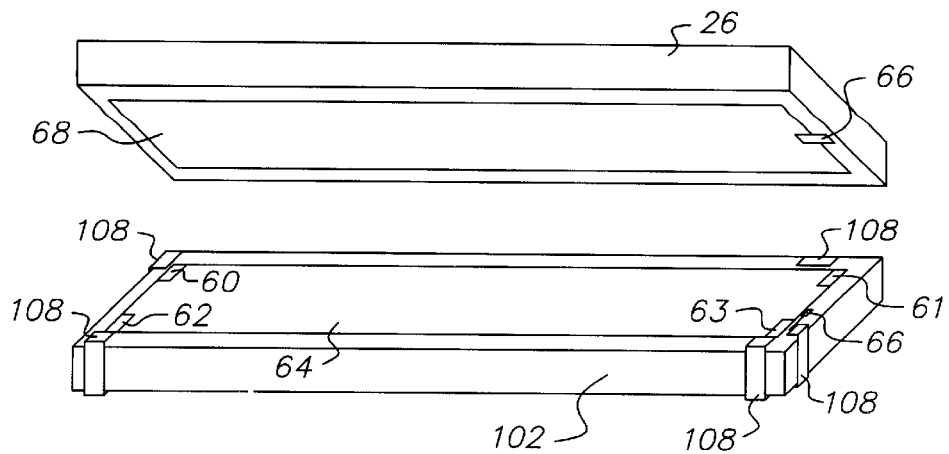
FIGS. 13a and 13b are schematic diagrams showing a 5-wire touch screen according to the present invention.
Figure 13B:
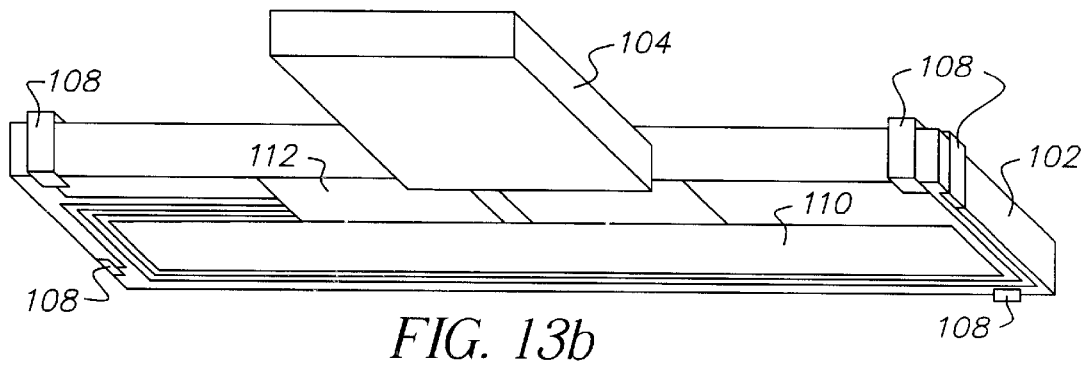

FIG. 12 shows the electrical structure of a prior art 5-wire resistive touch screen. The lower circuit layer 20 contains four metal electrodes 60, 61, 62 and 63 located at the corners, connected to a resistive ITO coating 64. The four metal electrodes 60, 61, 62 and 63 also connect to four conductors in cable 16. Also in the lower circuit layer is a metal electrode 66 that connects to a conductor in cable 16. The upper circuit layer 26 contains one metal electrode 65 connected to a transparent metal conductive area 68. A flexible spacer layer (not shown) separates the lower circuit layer 20 and the upper circuit layer 26. When manufactured, metal contacts 65 and 66 are electrically connected together, transferring the voltage on the transparent metal conductive area 68 to the cable 16. To sense a touch, an external touch screen controller (not shown) applies voltages to the four metal electrodes 60, 61, 62 and 63, forming a voltage gradient in the intervening resistive ITO coating 64. Normally, two of these four metal electrodes always have a constant voltage applied to them. The two metal electrodes held to constant voltages are usually diagonal to each other; for example, metal electrode 60 would have a constant voltage 5V, and metal electrode 63 would have a constant voltage 0V. The coordinate measured then depends on the voltage applied to the remaining two metal electrodes 61 and 62. The fifth metal electrode 65 is used as a voltage probe point. When the touch occurs, resistive ITO coatings 64 and the transparent metal conductive area 68 are shorted at the point of contact. The voltage at that point on the resistive ITO coating is transferred to the transparent metal conductive area, the attached metal electrode 65, and to the touch detection circuit 36 (see FIG. 1a) within external touch screen controller 18 (see FIG. 1a) via a conductor in cable 16. The touch detection circuit monitors the voltage read from the touch screen, decides when a touch has been performed, and computes the (X, Y) coordinates of the touch point.

To measure the X coordinate, a voltage gradient is placed across the resistive ITO coating 64 in the X-direction. To do so, 5V would be applied to metal electrode 62 and 0V would be applied to metal electrode 61. To measure the Y coordinate, 5V would be applied to metal electrode 61 and 0V would be applied to metal electrode 62.

As with 4-wire touch screens, various amounts of 5-wire touch screen controller functionality may be implemented within the touch screen controller 112 located on the electroluminescent display side of the substrate, based on system design constraints, as described in relation to FIGS. 6, 7 and 8. The multiplexing circuit 38 is significantly different for a 5-wire touch screen controller.

Figure 14:
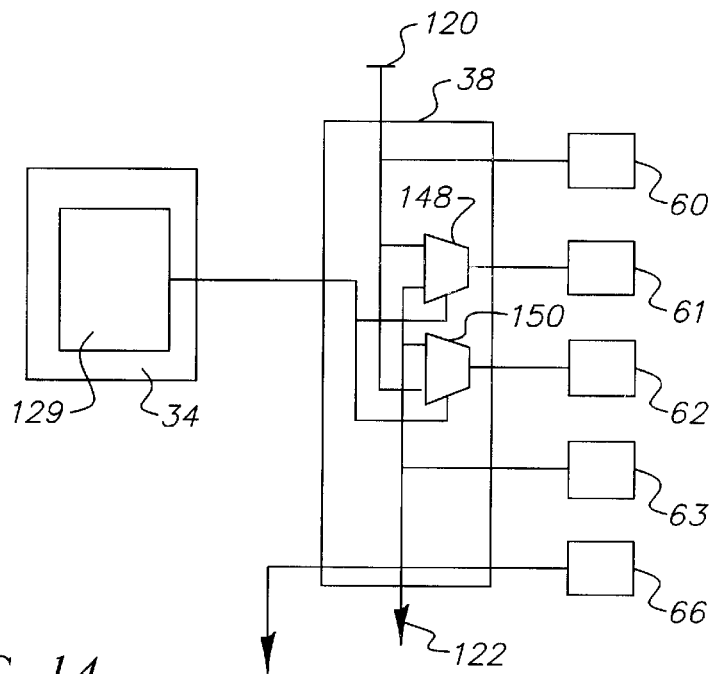
FIG. 14 is a schematic diagram of a voltage selection circuit and a multiplexing circuit for 5-wire touch screen controllers, according to the present invention.

FIG. 14 shows an embodiment of the present invention for a voltage application circuit 34 and a multiplexing circuit 38 used with a 5-wire touch screen. For the current embodiment, the voltage application circuit 34 contains an X/Y coordinate selection circuit 129. No inverter is needed, as is required for the 4-wire embodiment. Otherwise, the operation of the voltage application circuit 34 is equivalent to that of the 4-wire embodiment described in relation to FIG. 11.

Referring to FIG. 14, the multiplexing circuit 38 consists of two electronic switches 148 and 150 that determine the voltage sent to metal electrodes 61 and 62. Metal electrode 60 is set to voltage 120 while metal electrode 63 is set to voltage 122.

When the X/Y coordinate selection circuit 129 contains a logic high, electronic switch 148 places voltage 120 on metal electrode 61 and electronic switch 150 places voltage 122 on metal electrode 63, causing a voltage gradient to be formed across resistive ITO coating 64 in the Y direction. When the X/Y coordinate selection circuit contains a logic low, electronic switch 148 places voltage 122 on metal electrode 61 and electronic switch 150 places voltage 120 on metal electrode 63, causing a voltage gradient to be formed across resistive ITO coating 64 in the X direction. Metal electrode 65 is always connected, via the multiplexing circuit, to either an analog-to-digital converter 40 (not shown), or to a conductor in cable 104 (not shown).

The invention has been described in detail with particular reference to certain preferred embodiments thereof, but it will be understood that variations and modifications can be effected within the spirit and scope of the invention. Although the invention was described with respect to 4 and 5 wire resistive touch screens, other forms of touch screens can also be implemented according to the present invention. For example, the controllers for 8-wire resistive touch screens, capacitive touch screen, and surface acoustic wave touch screens can also be incorporated into the transistor layer of an active matrix OLED display according to the present invention.

PARTS LIST

- 10 Resistive touch screen
- 12 Substrate
- 14 Touch sensitive elements
- 16 Cable
- 18 External controller
- 20 Lower circuit layer
- 22 Flexible spacer layer
- 24 Spacer dot
- 26 Upper circuit layer
- 28 Top protective layer
- 30 Printed circuit board
- 32 Connector
- 34 Voltage application circuit
- 36 Touch detection circuit
- 38 Multiplexing circuit
- 39 Integrated circuit
- 40 Analog-to-digital converter
- 42 Computation circuit
- 50 Metal bar
- 51 Metal bar
- 52 Metal bar
- 53 Metal bar
- 54 Resistive ITO coating
- 56 Resistive ITO coating
- 60 Metal electrode
- 61 Metal electrode
- 62 Metal electrode
- 63 Metal electrode
- 64 Resistive ITO coating
- 65 Metal electrode
- 66 Metal electrode
- 68 Transparent metal conductive area
- 70 Flat panel display
- 72 Substrate
- 74 Transistor switching matrix layer
- 76 Thin film transistor
- 78 Light emission layer
- 80 Cable
- 81 External controller
- 82 Frame
- 84 Mechanical separator
- 100 Electroluminescent display
- 102 Single substrate
- 104 Cable
- 106 External electronics
- 108 Conductor
- 110 Active area
- 112 Touch screen controller
- 120 Voltage
- 122 Voltage
- 124 Clock pulse train
- 126 Clock divider circuit
- 128 digital interface circuit
- 129 X/Y coordinate selection circuit
- 130 Inverter 134 Tristate buffer
136 Tristate buffer
138 Tristate buffer
140 Tristate buffer
142 Electronic switch
144 Electronic switch
148 Electronic switch
150 Electronic switch

What is claimed is:

1. An organic electroluminescent display with integrated touch screen, comprising:
   a) a transparent substrate having two faces;
   b) a transistor switching matrix and a light emitting layer forming an active matrix electroluminescent display located on one face of the substrate for emitting light through the substrate;
   c) touch sensitive elements of a touch screen located on the other face of the substrate;
   d) components of a touch screen controller located on the one face of the substrate; and
   e) an electrical connector for connecting the components of the touch screen controller on the one face of the substrate to the touch screen elements on the other face of the substrate.

2. The display of claim 1, wherein the electroluminescent display is an organic light emitting diode display (OLED).

3. The display of claim 1, wherein the touch screen is a resistive touch screen, and the touch screen controller is a resistive touch screen controller.

4. The display of claim 3, where the resistive touch screen is 4-wire.

5. The display of claim 3, where the resistive touch screen is 5-wire.

6. The display of claim 3, wherein the touch screen controller is responsive to control signals that control the electroluminescent display.

7. The display of claim 1, wherein the electrical connector contains fewer conductors than is required if the touch screen controller is located external to the organic electroluminescent display.

8. The display of claim 1, wherein the substrate is glass.

9. The display of claim 1, wherein the substrate is plastic.

10. The display of claim 1, wherein the components of the touch screen located on the one face of the substrate comprise:
    a) a voltage application circuit responsive to signals present for control of the light emitting elements, and
    b) a multiplexing circuit for selection of voltage application to the touch sensitive elements and for routing the measured voltage gradient in analog form to the electrical connector for computation by an external controller.

11. The display of claim 10, wherein the components of the touch screen located on the one face of the substrate, further comprise an analog-to-digital converter for converting a measured analog voltage to digital format for transmission over to the electrical connector for computation by an external controller.

12. The display of claim 11, wherein the components of the touch screen located on the one face of the substrate, further comprise a computation circuit for computing the coordinate of a touch.

13. The display of claim 1, further comprising means for generating a periodic signal for synchronizing the electroluminescent display operations and the touch screen controller.

14. The display of claim 13, wherein the periodic signal is a clock signal.

15. The display of claim 14, where the clock signal is a pixel clock.

16. The display of claim 13, further comprising a divider circuit located in the touch screen controller to produce a lower periodic frequency signal for synchronizing the touch screen controller.

17. The display of claim 13, where the periodic signal is a horizontal synchronization signal.

18. The display of claim 13, where the periodic signal is a vertical synchronization signal.

* * * * *